United States Patent [19]

Bienstock

[11] Patent Number: 4,861,421
[45] Date of Patent: Aug. 29, 1989

[54] PHOTOCHEMICAL SEMICONDUCTOR ETCHING

[75] Inventor: Rachelle J. Bienstock, Richardson, Tex.

[73] Assignee: Texas Instruments Incorporated, Dallas, Tex.

[21] Appl. No.: 201,007

[22] Filed: Jun. 1, 1988

[51] Int. Cl.$^4$ .................... H01L 21/306; B44C 1/22
[52] U.S. Cl. .................... 156/635; 156/643; 156/654; 156/662; 252/79.1; 252/79.2; 252/79.5
[58] Field of Search ............... 156/635, 643, 647, 654, 156/659.1, 662; 437/5, 234; 252/79.1, 79.2, 79.4, 79.5

[56] References Cited

U.S. PATENT DOCUMENTS 4,310,583  1/1982  Baker et al. .................. 156/655 X
4,518,456  5/1985  Bjorkholm .................... 156/635 X

OTHER PUBLICATIONS

Rothschild et al, Laser Photosublimation ... 2 J. Mat. Res 244 (1987), p. 247.
Arnone et al, Laser Etching ... 48 Appl. Phys. Lett. 736 (1986).
Donohue, Etching of Metal ... (Gutfiled et al Eds., 1985 MRS, Pittsburgh, pp. 139-141.
Podlesnik et al, Waveguiding Effects ... 48 Appl. Phys. Lett, pp. 496, (1986).
Brewer et al, Excimer Laser ... 49 Appl. Phys. Lett 803 (1986).

*Primary Examiner*—William A. Powell
*Attorney, Agent, or Firm*—Carlton H. Hoel; Leo N. Heiting; Melvin Sharp

[57] ABSTRACT

Laser (12) assisted photochemical etching of $Hg_{1-x}Cd_xTe$-type compounds (30) in solutions of bromine and other oxidants.

7 Claims, 4 Drawing Sheets

←7μm→

←—10 μm—→

PHOTOCHEMICAL SEMICONDUCTOR ETCHING

BACKGROUND OF THE INVENTION

1. Field of the Invention

The present invention relates to processing of semiconductor materials, and, more particularly, to laser assisted photochemical etching of semiconductors.

2. Description of the Related Art

Alloys of mercury telluride and cadmium telluride, generically denoted $Hg_{1-x}Cd_xTe$, are extensively employed as photosensitive semiconductors for infrared radiation detection. Indeed, $Hg_{0.8}Cd_{0.2}Te$ has a bandgap of about 0.1 eV which corresponds to a photon wavelength of 12 μm and $Hg_{0.73}Cd_{0.27}Te$ a bandgap of about 0.24 eV corresponding to a photon wavelength of 5 μm; and these two wavelengths are in the two atmospheric windows of greatest interest for infrared detectors. Extrinsic p-type $Hg_{1-x}Cd_xTe$ has potential application in infrared focal plane arrays operating in the 10-12 μm wavelength window.

Processing of $Hg_{1-x}Cd_xTe$ to fabricate infrared detector devices requires etching patterns in $Hg_{1-x}Cd_xTe$ substrates, and the current standard method of etching is ion milling which produces gross damage to the $Hg_{1-x}Cd_xTe$. A solution of 0.125% bromine in methanol is a standard etchant for lapping and polishing $Hg_{1-x}Cd_xTe$, but it is difficult to control and has not been used to etch patterns. A combination of ion milling followed by spray etching with 0.125% bromine in methanol to form large tapered vias in $Hg_{1-x}Cd_xTe$ appears in U.S. Pat. No. 4,447,291. However, the known methods do not provide a damage-free etch that can be used to etch small features with vertical sidewalls.

CdTe and $Hg_{1-x}Cd_xTe$ have been experimentally etched with lasers by photosublimation; see M. Rothschild et al, Laser Photosublimation of Compound Semiconductors 2 J. Mat. Res. 244 (1987) and C. Arnone et al, Laser Etching of 0.4 μm Structures in CdTe by Dynamic Light Guiding. This approach focusses a laser beam onto a spot to locally vaporize the $Hg_{1-x}Cd_xTe$, and the pit or groove being etched forms a dynamic wave guide and keeps the pit or groove narrow. The sublimation leaves a tellurium residue lining the etched pit or groove and disrupts stoichiometry.

Thus the known methods do not selectively etch $Hg_{1-x}Cd_xTe$ without stoichiometry disruption, substrate damage or photoresist use.

Other semiconductors such as silicon and GaAs are generally more robust than $Hg_{1-x}Cd_xTe$ and have been etched successfully by various methods. For example, T. Donohue, Etching of Metal and Semiconductor Surfaces by Liquid-Phase Laser Photolysis in Beam Induced Chemical Processes (R. Gutfield et al eds, 1985 Mat. Res. Soc., Pittsburgh) reports etching of GaAs and copper by laser assisted wet etching in bromine and cerium chloride solutions, although the etching of the GaAs was at a very low rate.

Laser assisted etching of GaAs (or Si and InP) is reported in D. Podlesnik et al, Waveguiding Effects in Laser-Induced Aqueous Etching of Semiconductors, 48 Appl. Phys. Lett. 496 (1986) wherein a UV laser beam was focussed to a spot or patterned on a GaAs substrate immersed in a dilute nitric acid solution. The sidewalls of the grooves being etched provide a waveguide effect for the laser beam and deep narrow grooves were etched.

Laser projection dry etching of GaAs is reported in P. Brewer et al, Excimer Laser Projection Etching of GaAs, 49 Appl. Phys. Lett. 803 (1986). A laser beam was projected onto a GaAs substrate in a low pressure HBr atmosphere; the laser presumably dissociated the HBr into Br atoms which combined with the Ga and As to etch the substrate, producing volatile $GaBr_3$ and $AsBr_3$.

While various laser-assisted photochemical etches have been found for silicon and GaAs (and other III-V compounds), it is a problem to find etches applicable to $Hg_{1-x}Cd_xTe$ or other II-VI compounds that avoid stoichiometry disruption, substrate damage, and use of photoresist.

SUMMARY OF THE INVENTION

The present invention provides for laser assisted low temperature photochemical etching of $Hg_{1-x}Cd_xTe$-type compounds. The chemical agent is an oxidant activated by the laser in a solution that makes the oxidized mercury, cadmium, and tellurium soluble. In preferred embodiments the chemical agent is bromine in either water or methanol solution or strong aqueous nitric acid of KOH, and the laser beam is projected through a patterned mask to selectively etch only predetermined areas of a substrate.

The laser assisted photochemical etching solves the material damage and control problems of the known $Hg_{1-x}Cd_xTe$ etches without the use of photoresists and is not a physically abrasive technique. Also, projection patterning eliminates steps where resist must be applied, exposed, baked and removed.

DESCRIPTION OF THE PREFERRED EMBODIMENTS

Figure 1:
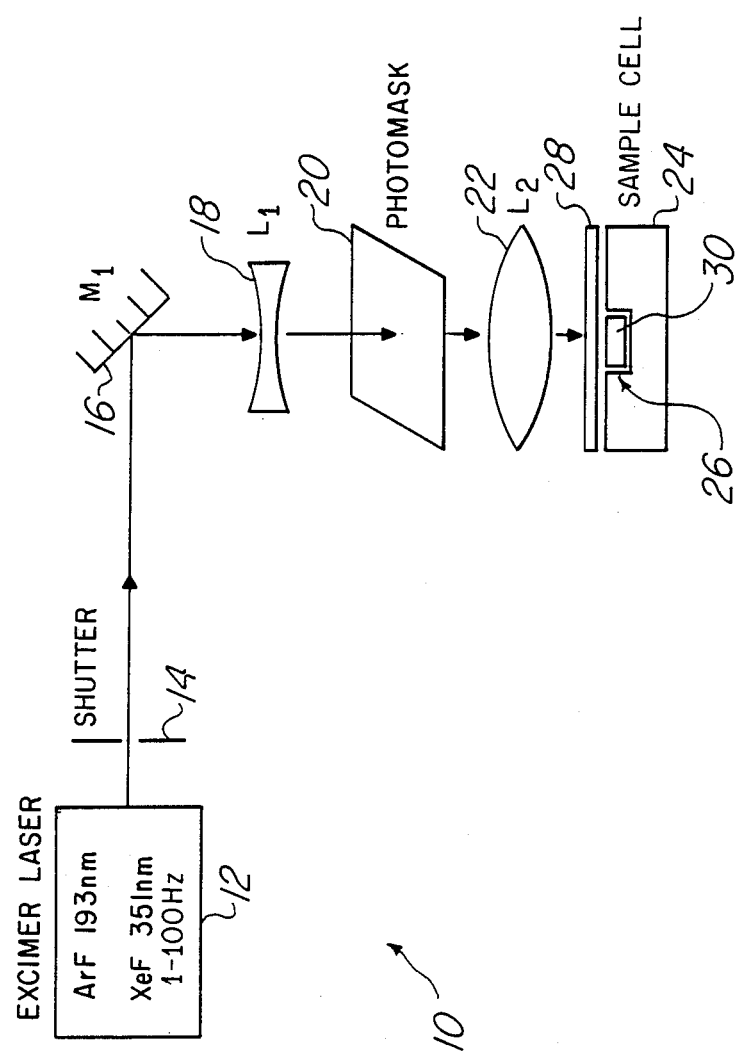
FIG. 1 is a schematic view of an apparatus for performing the preferred embodiment methods.

The first preferred embodiment method of etching $Hg_{1-x}Cd_xTe$ uses apparatus 10 schematically illustrated in FIG. 1. Apparatus 10 includes XeF excimer laser 12, shutter 14, mirror 16, concave lens 18, chrome-on-quartz photomask 20, convex lens 22, quartz sample cell 24 with cavitroned depression 26 and quartz coverplate 28. Laser 12 radiates in the ultraviolet at a wavelength of 351 nm with pulses of 10-20 nsec duration and 42 mJ pulse energy; laser 12 is pulsed at 30 Hz. Lens 22 provides a 1:1 imaging of photomask 20 onto $Hg_{1-x}Cd_xTe$ substrate 30 in depression 26. The feature sizes on photomask may be as small as one micron and still be resolved on substrate 30, although this is diffraction limited. The first preferred embodiment method proceeds as follows.

Place Hg₀.₈Cd₀.₂Te substrate 30 to be etched in depression 26 (which is about 0.7 mm deep and slightly larger than the substrate to be etched); the typical size for substrate 30 is about 20 mm by 5 mm by 0.5 mm thick. Fill depression 26 with deionized water saturated with bromine (Br$_2$) at room temperature, and place coverplate 28 on cell 24 to level the liquid in depression 26. The optical depth of the liquid must be minimized to avoid absorption of the laser radiation away from substrate 30. Position photomask 20 (which contains the pattern to be etched in substrate 30) to align the pattern on substrate 30 and activate laser 12. Laser 12 radiation photolyzes the bromine in solution to yield bromine radicals (Br$_2$+hω→2Br). The bromine radicals adsorb on the surface of substrate 30 and oxidize it to produce soluble oxides by reactions such as:

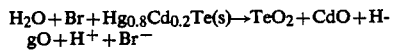

The tellurium oxide is slightly soluble and the cadmium oxide and mercury oxide are soluble in water with low pH. (See, D. Aspnes et al, Nondestructive Analysis of Hg$_{1-x}$Cd$_x$Te (x=0.00, 0.20, 0.29, and 1.00) by spectroscopic ellipsometry. I. Chemical Oxidation and Etching, 2 J. Vac. Sci. Tech. A 1309 (1984).) The photolyzation of the bromine only occurs at the portion of the surface of substrate 30 illuminated by laser 12 radiation, and the bromine radicals have limited diffusion to insure etching of substrate 30 only about the illuminated portions. One minute of etching removes about 6,000 Å of Hg$_{0.8}$Cd$_{0.2}$Te. Note that excimer lasers are not highly collimated laser sources and can be projected without consideration of laser speckle.

Second preferred embodiment method of etching also uses apparatus 10 but with the change of moving photomask 20 down to replace coverplate 28; this change overcomes the diffraction problem of the first preferred embodiment method and permits resolution on substrate 30 of 0.2 μm wide lines from photomask 20. The distance from photomask 20 to substrate 30 is only 0.4 mm and the focal length of lens 22 is 25 mm, so no significant loss of focus occurs. The liquid etchant used in depression 26 is 0.03% bromine in methanol, and laser 12 radiation photolyzes the bromine to yield bromine radicals as in the first preferred embodiment method. The bromine radicals oxidize the Hg$_{0.8}$Cd$_{0.2}$Te to produce methanol soluble oxides by reactions such as:

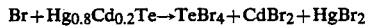

Figure 2A:
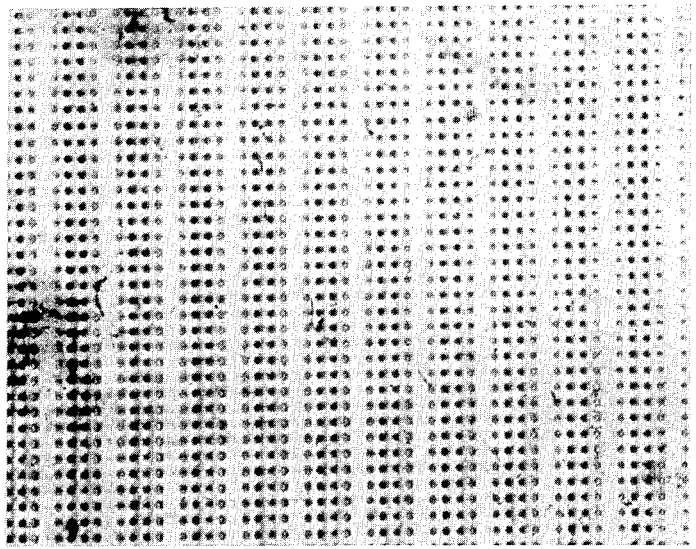
FIGS. 2A-B show an array of trenches etched in $Hg_{0.8}Cd_{0.2}Te$ by the second preferred embodiment method.
Figure 2B:
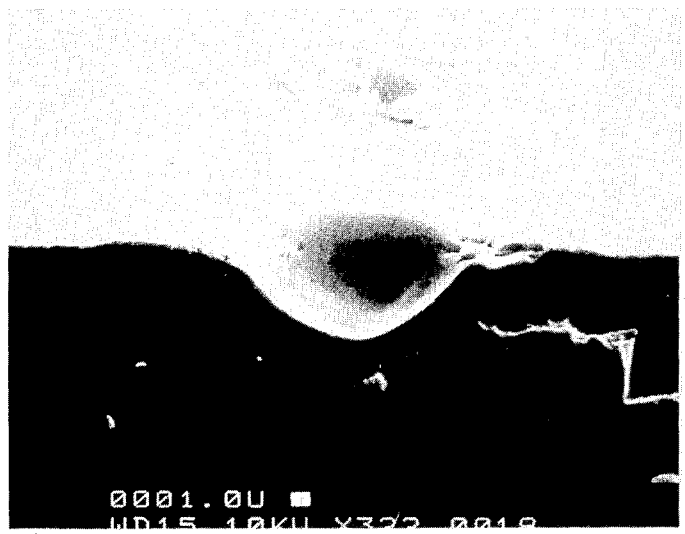

With laser 12 providing 60 mJ energy pulses at a repetition rate of 30 Hz, vias approximately 7 μm deep and 10 μm wide can be etched over the entire substrate in 8 minutes. The vias have smooth sidewalls and a natural tapered shape but with no thermal damage; see FIGS. 2A–B which show a portion of an array of such vias in perspective view and a cross sectional elevation view of a single via of the array, respectively.

Figure 3:
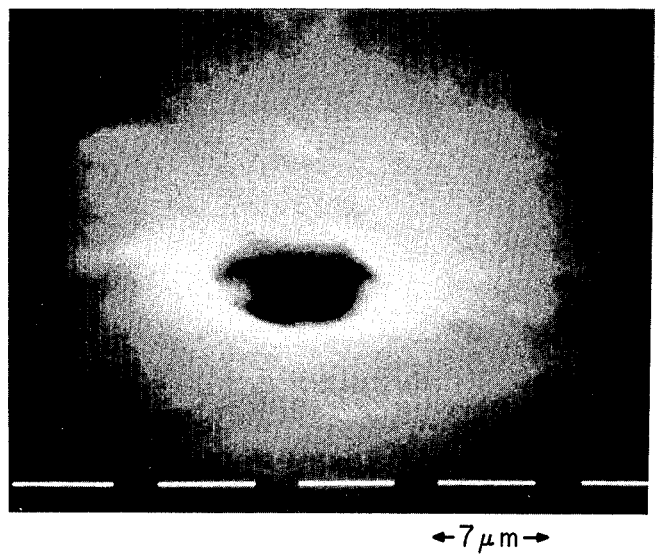
FIG. 3 is a perspective view of a trench etched in $Hg_{0.8}Cd_{0.2}Te$ by the third preferred embodiment method.

Third preferred embodiment method of etching Hg$_{1-x}$Cd$_x$Te uses a focussed beam from an argon ion laser operating at 514.5 nm and an etching solution of 5% HNO$_3$ in water; a Hg$_{0.8}$Cd$_{0.2}$Te substrate is held in a quartz cell similar to cell 24 of FIG. 1 that prevented motion during the etching. The laser beam spot size was focussed to about 1 micron and etched trenches with steep sidewalls and diameters of about 1 to 2 microns. Residual amounts of tellurium oxide were found adhered to the sidewalls of the trenches; see FIG. 3 which is a perspective view of a trench.

Figure 4:
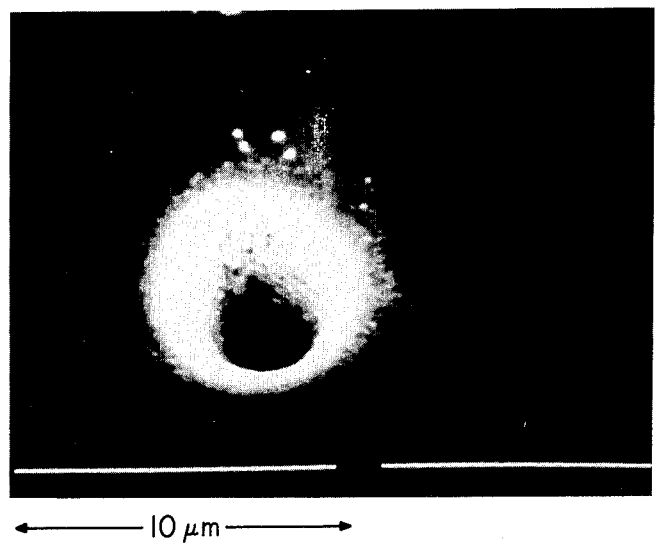
FIG. 4 is a perspective view of a trench etched in $Hg_{0.8}Cd_{0.2}Te$ by the fourth preferred embodiment method.

Fourth preferred embodiment method of etching Hg$_{1-x}$Cd$_x$Te uses a focussed beam from an argon ion laser operating at 514.5 nm and an etching solution of 1% HSO$_4$ and 1% H$_2$O$_2$ in water; a Hg$_{0.8}$Cd$_{0.2}$Te substrate is held in a quartz cell similar to cell 24 of FIG. 1 that prevented motion during the etching. The laser beam spot size was focussed to about 7 microns and etched trenches with steep sidewalls and diameters about 6 to 8 microns. Residual amounts of tellurium oxide were found to adhere to the sidewalls of the trenches; see FIG. 4 for a perspective view.

Figure 5:
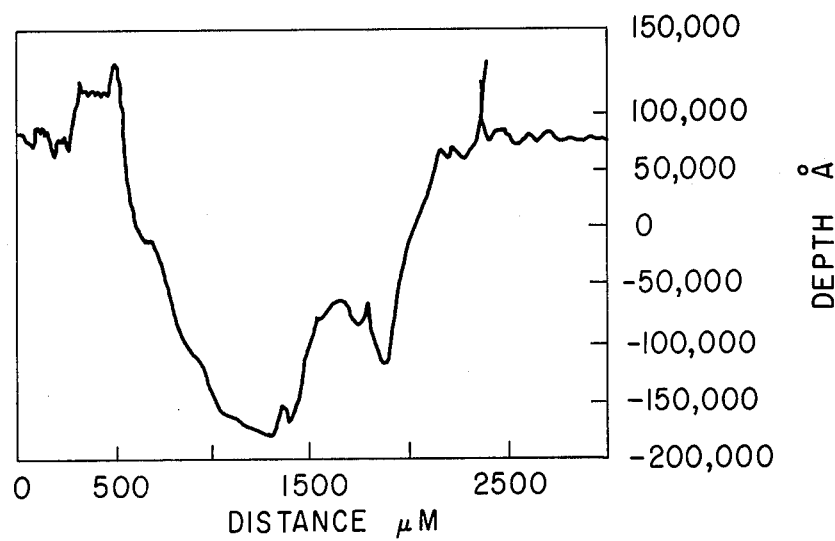
FIG. 5 show a profilometer measurement of a trench etched in $Hg_{0.8}Cd_{0.2}Te$ by the fifth preferred embodiment method.

Fifth preferred embodiment method of etching Hg$_{1-x}$Cd$_x$Te uses an unfocussed beam from an argon ion laser operating at 514.5 nm and an etching solution of 5% KOH in water; a Hg$_{0.8}$Cd$_{0.2}$Te substrate is held in a quartz cell similar to cell 24 of FIG. 1 that prevented motion during the etching. The laser beam power was 100 mW and the beam had a diameter of about 2 mm and etched a single large trench without masking. FIG. 5 shows the trench depth after ten minutes of etching as measured by a stylus profilometer.

MODIFICATIONS AND ADVANTAGES

Various modifications of the preferred embodiment devices and methods may be made while retaining the feature of photoactivation of oxidizing species in solution for Hg$_{1-x}$Cd$_x$Te etching with soluble oxidation products. For example, the dimensions and shapes of the sample cell, the laser type and frequency and power, the substrate shape and size and material composition (Hg$_{1-x}$Cd$_x$Te for various x and in the form of epilayers on other substrates such as CdTe, CdZnTe, CdMnTe; Hg$_{1-x}$Zn$_x$Te; etc.), the duration of etching and the laser pulse rate may all be varied. Indeed, nonlaser illumination sources providing sufficient power to yield oxidizing species by photolyzation without excessive heating would also apply.

The invention provides the advantages of low temperature selective etching of Hg$_{1-x}$Cd$_x$Te-type compounds.

What is claimed is:

1. A method of etching Hg$_{1-x}$Cd$_x$Te, comprising the steps of:
   (a) immersing a substrate containing a Hg$_{1-x}$Cd$_x$Te region at a surface in a solution of an oxidant; and
   (b) photoactivating said oxidant at predetermined areas of said surface to etch predetermined portions of said Hg$_{1-x}$Cd$_x$Te region.
2. The method of claim 1, wherein:
   (a) said photoactivating is by a laser beam projected through a mask onto said Hg$_{1-x}$Cd$_x$Te region.
3. The method of claim 2, wherein:
   (a) said solution of an oxidant is water saturated with bromine.
4. The method of claim 1, wherein:
   (a) said solution of an oxidant is methanol containing bromine.
5. The method of claim 1, wherein:
   (a) said solution of an oxidant is KOH in water.
6. The method of claim 1, wherein:
   (a) said solution of an oxidant is HSO$_4$ and H$_2$O$_2$ in water.
7. The method of claim 1, wherein:
   (a) said solution of an oxidant is HNO$_3$ in water.